United States Patent [19]

Kim et al.

[11] Patent Number: 5,677,103

[45] Date of Patent: Oct. 14, 1997

[54] POSITIVE PHOTORESIST COMPOSITION

[75] Inventors: Seong-Ju Kim; Joo-Hyeon Park; Ji-Hong Kim; Sun-Yi Park, all of Taejeon, Rep. of Korea

[73] Assignee: Korea Kumho Petrochemical Co., Ltd., Seoul, Rep. of Korea

[21] Appl. No.: 723,679

[22] Filed: Sep. 30, 1996

[30] Foreign Application Priority Data

Oct. 14, 1995 [KR] Rep. of Korea .................. 35529

[51] Int. Cl.⁶ ................................................ G03F 7/023
[52] U.S. Cl. .................... 430/191; 430/165; 430/192; 430/193; 534/557
[58] Field of Search ........................ 430/191, 192, 430/193, 165; 534/557

[56] References Cited

U.S. PATENT DOCUMENTS

| | | | |
|---|---|---|---|
| 5,173,389 | 12/1992 | Uenishi et al. | 430/192 |
| 5,219,714 | 6/1993 | Toukhy et al. | 430/191 |
| 5,248,582 | 9/1993 | Uenishi et al. | 430/193 |
| 5,340,688 | 8/1994 | Kawabe et al. | 430/192 |
| 5,407,779 | 4/1995 | Uetani et al. | 430/192 |
| 5,523,191 | 6/1996 | Kim et al. | 430/192 |
| 5,529,881 | 6/1996 | Kawabe et al. | 430/191 |
| 5,534,382 | 7/1996 | Kawabe et al. | 430/192 |
| 5,541,033 | 7/1996 | Blakeney et al. | 430/192 |
| 5,554,481 | 9/1996 | Kawabe et al. | 430/193 |
| 5,609,982 | 3/1997 | Sato et al. | 430/192 |

*Primary Examiner*—John S. Chu
*Attorney, Agent, or Firm*—Harrison & Egbert

[57] ABSTRACT

A positive photoresist composition which is of high resolution, high sensitivity and wide focusing range and suitable for high integration of semiconductor devices and shows superior resist pattern profile, comprising quinonediazide sulfonic acid ester as a photoresist, an alkali soluble resin, a solvent, and additives, said quinonediazide sulfonic acid ester being prepared through the esterification of 1,2-naphthoquinonediazidesulfonyl halide or 1,2-benzoquinonediazidesulfonyl halide with an aromatic hydroxy compound represented by the following structural formula I:

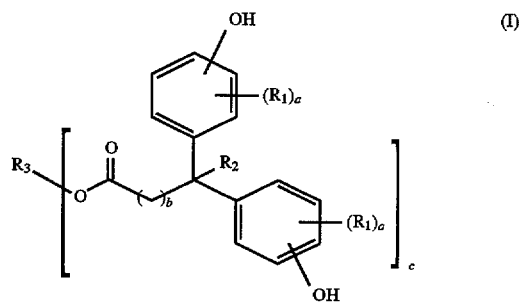

wherein $R_1$ and $R_2$ are independently hydrogen, halogen, an alkyl group or an alkoxy group; a is an integer of 1 to 3; b is an integer of 1 to 8; c is an integer of 1 to 12; and $R_3$ is an alkyl group containing ether, mercapthane, sulfoxide, sulfone, aryl group or hydroxy group.

9 Claims, No Drawings

POSITIVE PHOTORESIST COMPOSITION

BACKGROUND OF THE INVENTION

1. Field of the Invention

The present invention relates to a positive photoresist composition, with high sensitivity and resolution, which is useful to fabricate highly integrated semiconductor devices.

2. Description of the Prior Art

High integration of semiconductor devices are based on highly precise image-forming technologies. In most highly integrated semiconductor devices, the patterns formed are 0.5 micron or less in width. Correspondingly, photoresist used in the fine image-forming technologies is required to have a combination of high resolution, high thermal resistance, wide focusing range and superior resist pattern profile. Particularly for 64M or more DRAM, instead of g-line (436 nm), i-line (365 nm) is used to form fine patterns by virtue of its superior resolution and focusing depth.

A typical photoresist composition useful for the case comprises alkali soluble resin for forming coat, quinonediazide sulfonic acid ester of aromatic polyhydroxy compound, low molecular weight additive, dye and solvent. Particularly for aromatic polyhydroxy compound, polyhydroxybenzophenones have mostly been selected. It is, however, difficult to form excellent resist pattern profile 0.5 micron or less in width with such aromatic polyhydroxy compounds because they absorb a large quantity of light at 300 nm or shorter.

To avoid such a problem, many compounds into which phenols and aldehydes are condensed have been suggested. However, these compounds are likely to oxidize into quinones, at a high temperature, which show absorption of light at 300 nm or shorter and it is difficult to synthesize them.

SUMMARY OF THE INVENTION

Therefore, it is an object of the present invention to overcome the above problems encountered in prior arts and to provide a positive photoresist composition which is of high resolution, high sensitivity and wide focusing range.

It is another object of the present invention to provide a positive photoresist composition which is suitable for high integration of semiconductor devices.

It is a further object of the present invention to provide a positive photoresist composition which shows superior resist pattern profile.

Based on the intensive and thorough research by the present inventors, the above objects could be accomplished by a provision of a positive photoresist composition, comprising quinonediazide sulfonic acid ester as a photoresist, an alkali soluble resin, a solvent, and additives, said quinonediazide sulfonic acid ester being prepared through the esterification of 1,2-naphthoquinonediazidesulfonyl halide or 1,2-benzoquinonediazidesulfonyl halide with an aromatic hydroxy compound represented by the following structural formula I:

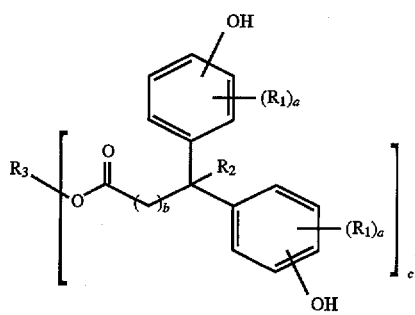

wherein $R_1$ and $R_2$ are independently hydrogen, halogen, an alkyl group or an alkoxy group;

a is an integer of 1 to 3;

b is an integer of 1 to 8;

c is an integer of 1 to 12; and $R_3$ is an alkyl group containing ether, mercapthane, sulfoxide, sulfone, aryl group or hydroxy group.

DETAILED DESCRIPTION OF THE INVENTION

The present invention is a positive photoresist composition comprising quinone diazide sulfonic acid ester of aromatic polyhydroxy compound, alkali soluble resin, solvent and additives.

As for the aromatic polyhydroxy compound, phenols containing at least three aromatic hydroxy groups are preferred. Phenols containing two or less aromatic hydroxy groups show a low solvation-preventive effect. In addition, they often gel during storage.

More preferred aromatic hydroxy compounds are phenolic compounds containing four or more aromatic hydroxy groups, represented by the following structural formula I:

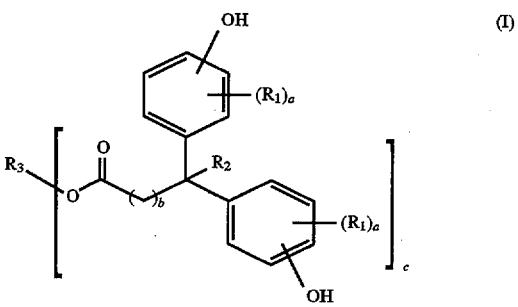

wherein $R_1$ and $R_2$ are independently hydrogen, halogen, an alkyl group or an alkoxy group; a is an integer of 1 to 3; b is an integer of 1 to 8; c is an integer of 1 to 12; $R_3$ is an alkyl group containing ether, mercapthane, sulfoxide, sulfone, aryl group or hydroxy group. The alkyl group which may be employed as $R_1$ or $R_2$ is a linear or branched one containing 1–4 carbon atoms and can preferably be exemplified by methyl, ethyl, isopropyyl and t-butyl. Similarly, the alkoxy group which may be employed as $R_1$ and $R_2$ is a linear or branched one containing 1–4 carbon atoms and can preferably be exemplified by methyl alkoxy, ethyl alkoxy, isopropyyl alkoxy and t-butyl alkoxy.

In the present invention, the aromatic polyhydroxy compounds of the structural formula I are synthesized as follows. 4,4-bis(4-hydroxyphenyl)valeric acids or 4,4-bis(4-hydroxyphenyl)valeric acid esters are esterified with alcohols containing at least two hydroxy groups. In this reaction, the alcohols include alkyl diols and polyols, such as glycerin, pentaerythritol, dipentaerithritoyl and tris(hydroxymethyl)ethane. This esterification is performed in the presence of a acidic or basic ordinary catalyst, such as dibutyl tin oxide. A reaction solvent may or may not be used.

Concrete examples of the aromatic polyhydroxy compounds represented by the structural formula I include:

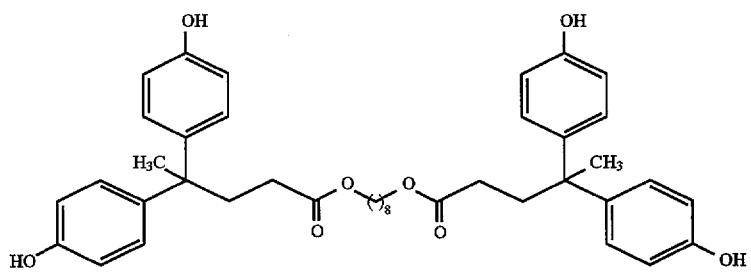
(I)-1

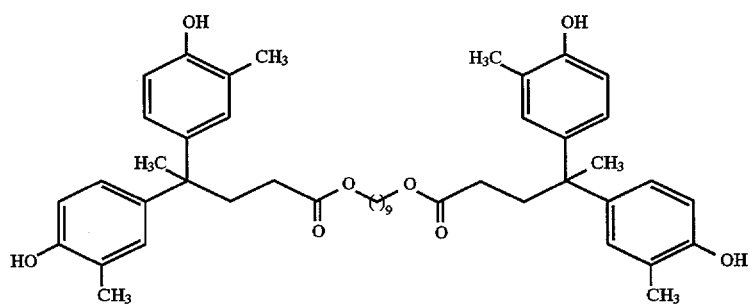
(I)-2

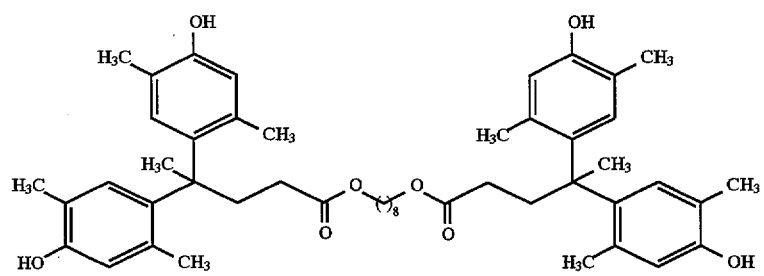
(I)-3

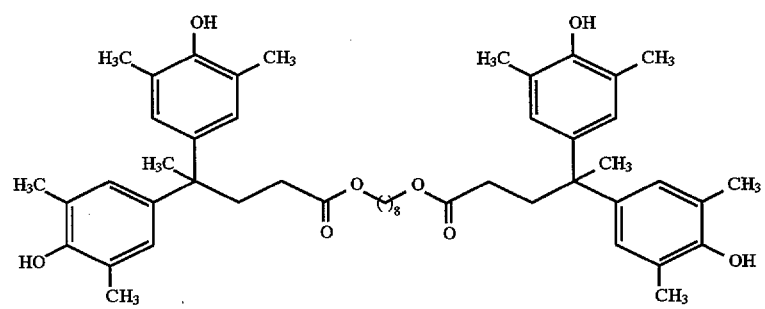
(I)-4

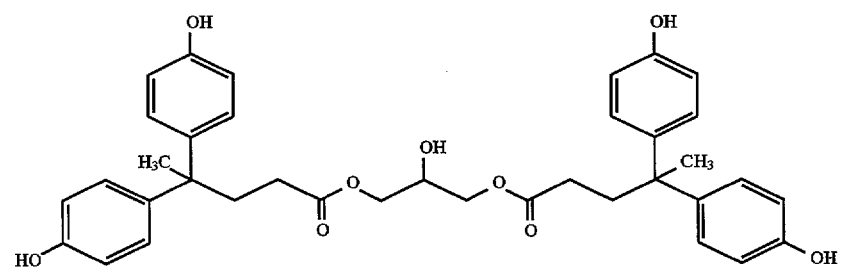
(I)-5

-continued
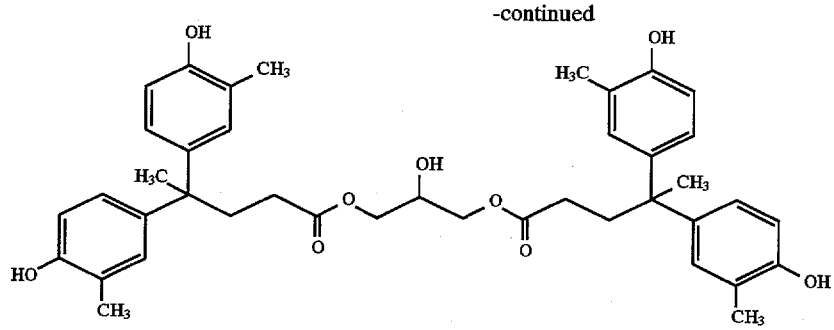 (I)-6
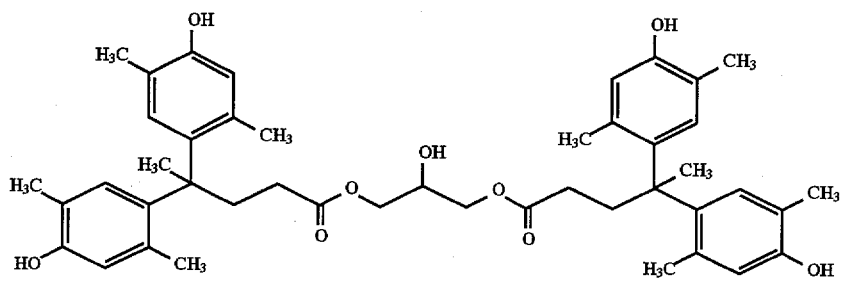 (I)-7
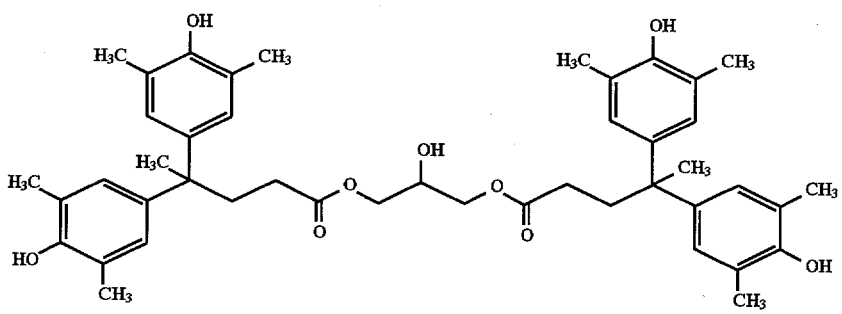 (I)-8
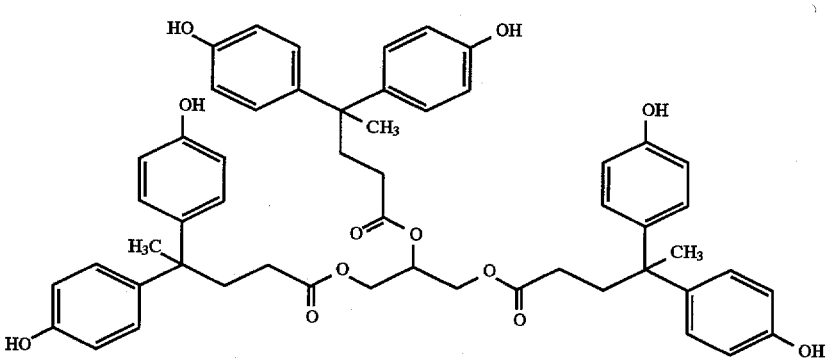 (I)-9
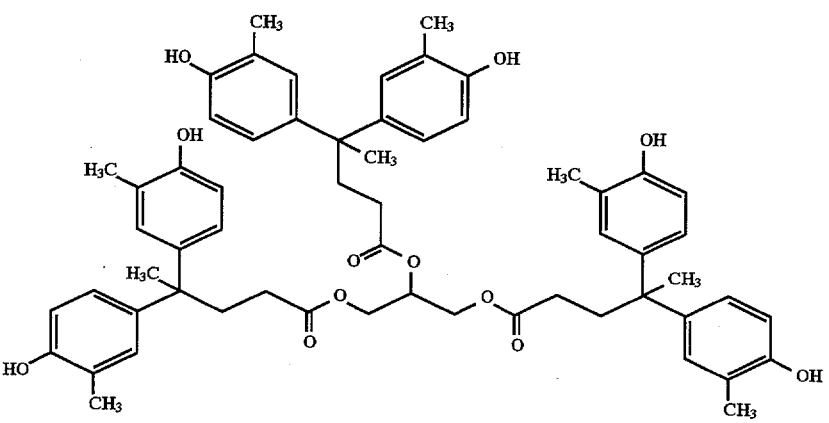 (I)-10

-continued
(I)-11
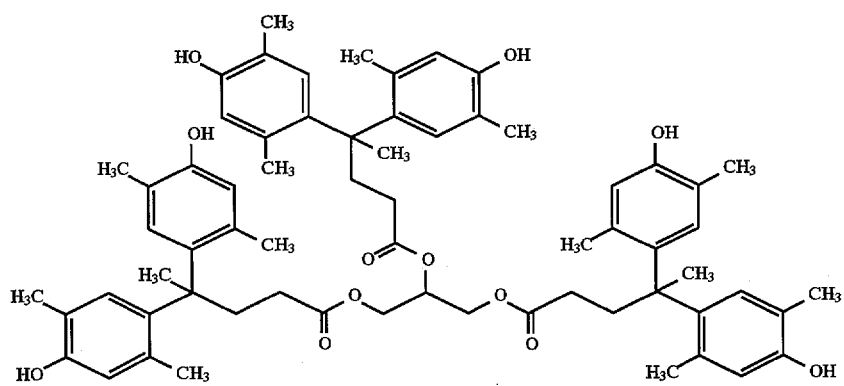
(I)-12
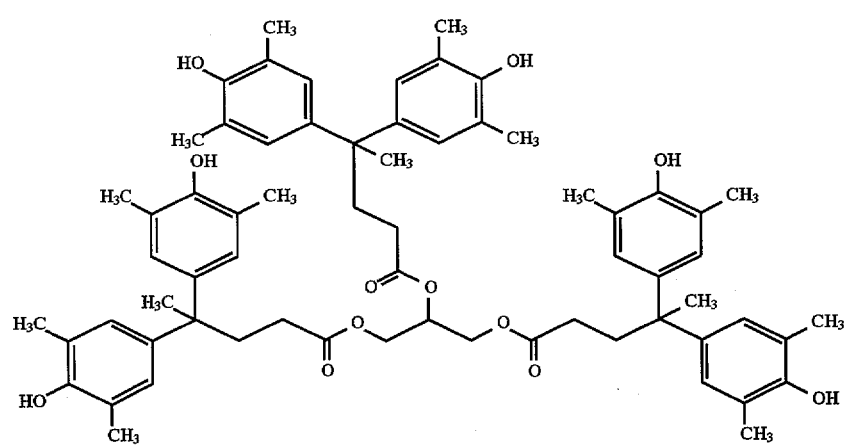
(I)-13
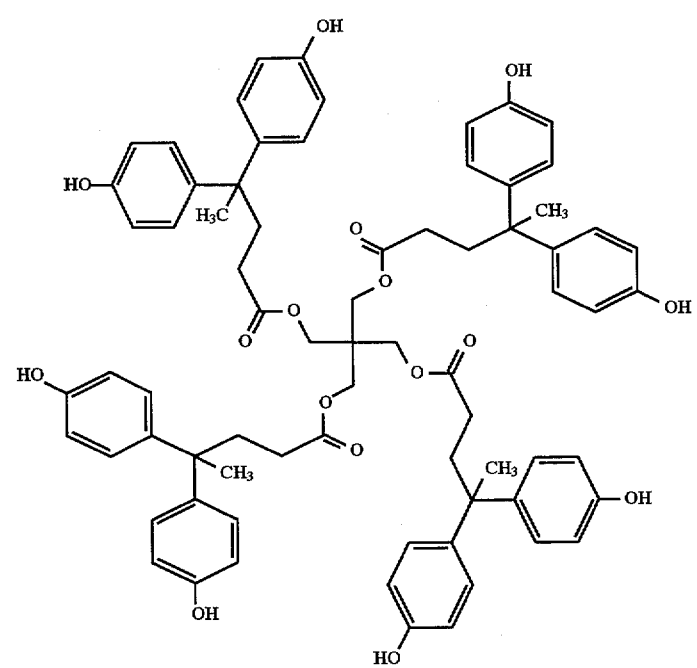

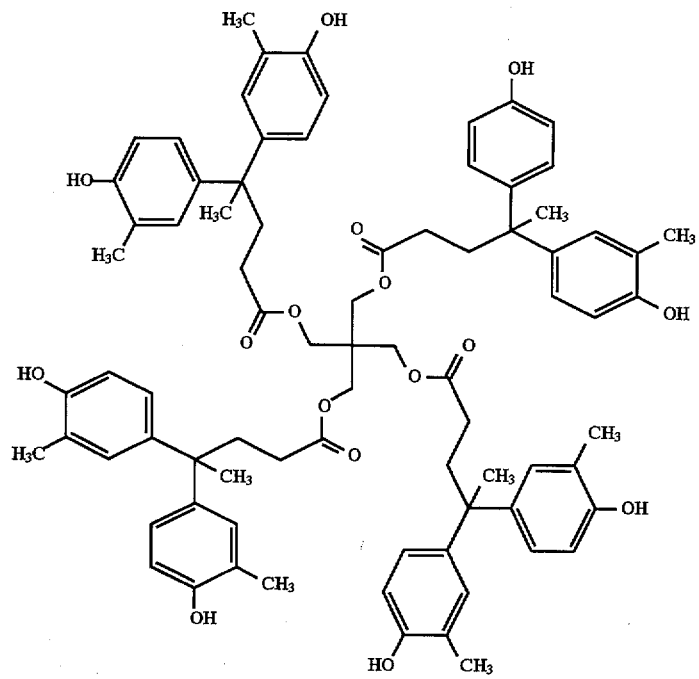
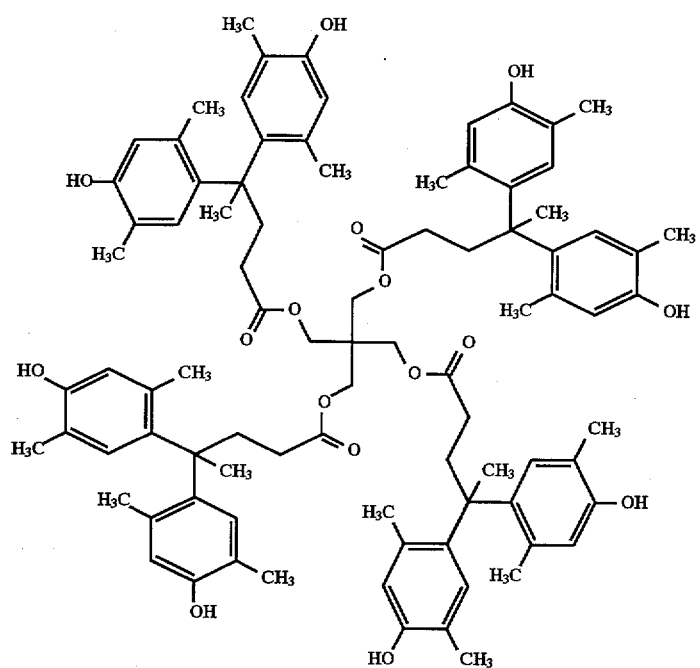
(I)-14
(I)-15

-continued
(I)-16
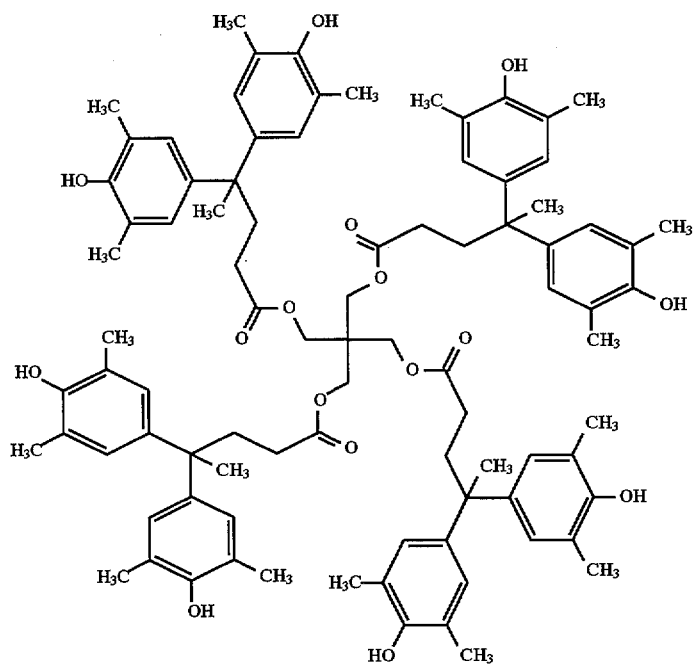
(I)-17
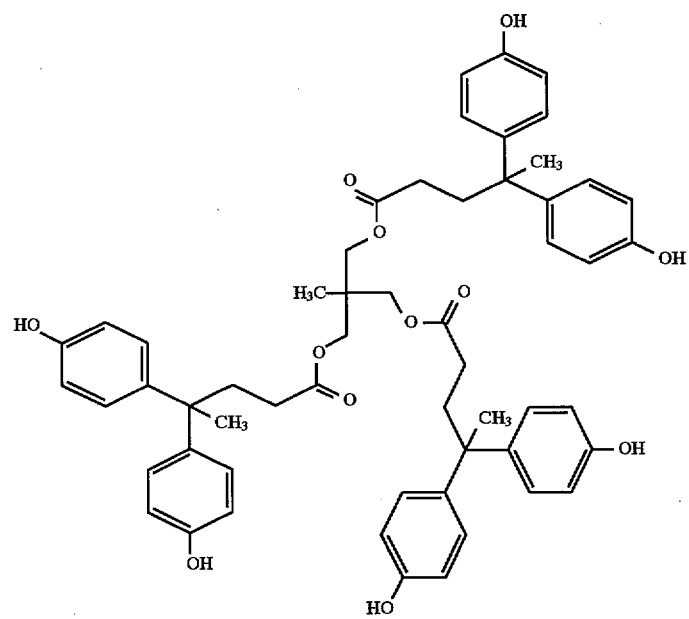

-continued
(I)-18
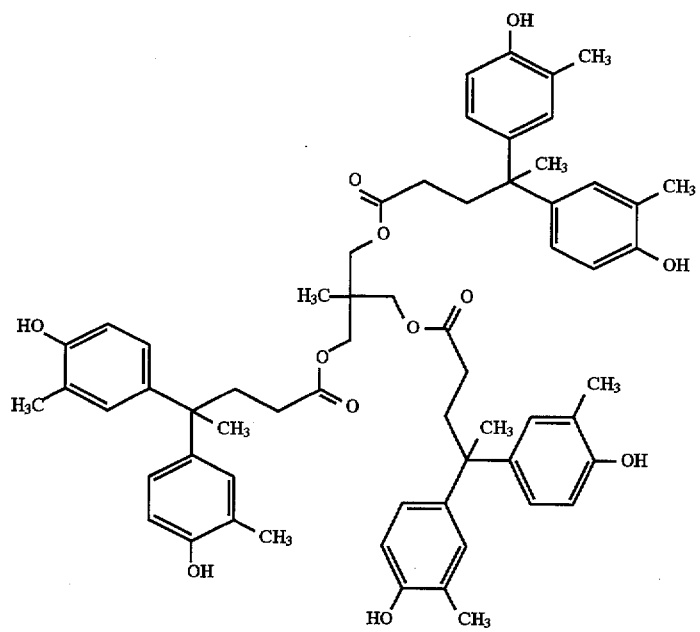
(I)-19
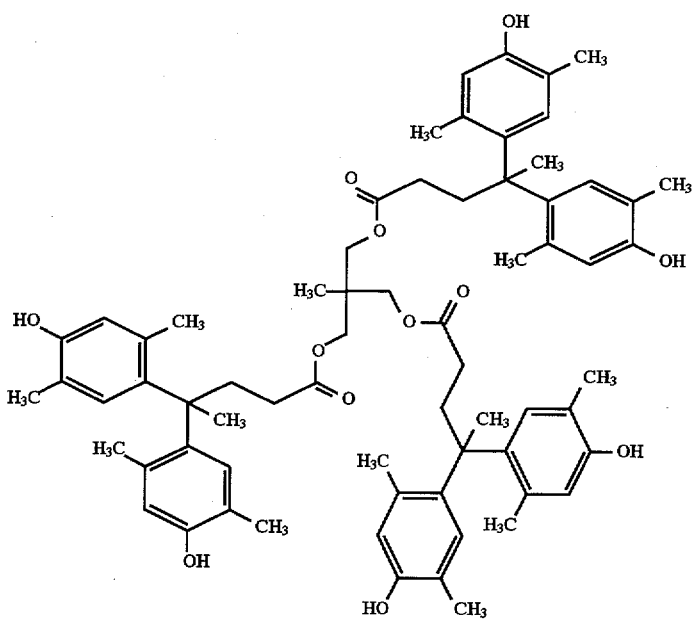

(I)-20
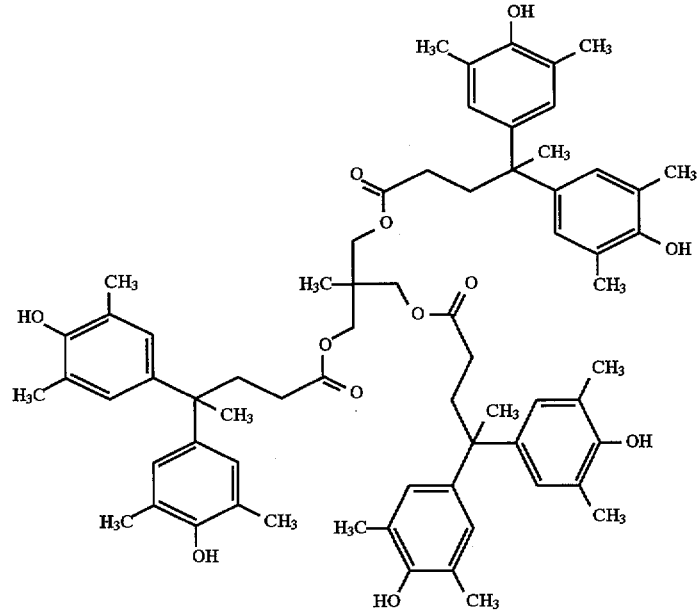
(I)-21
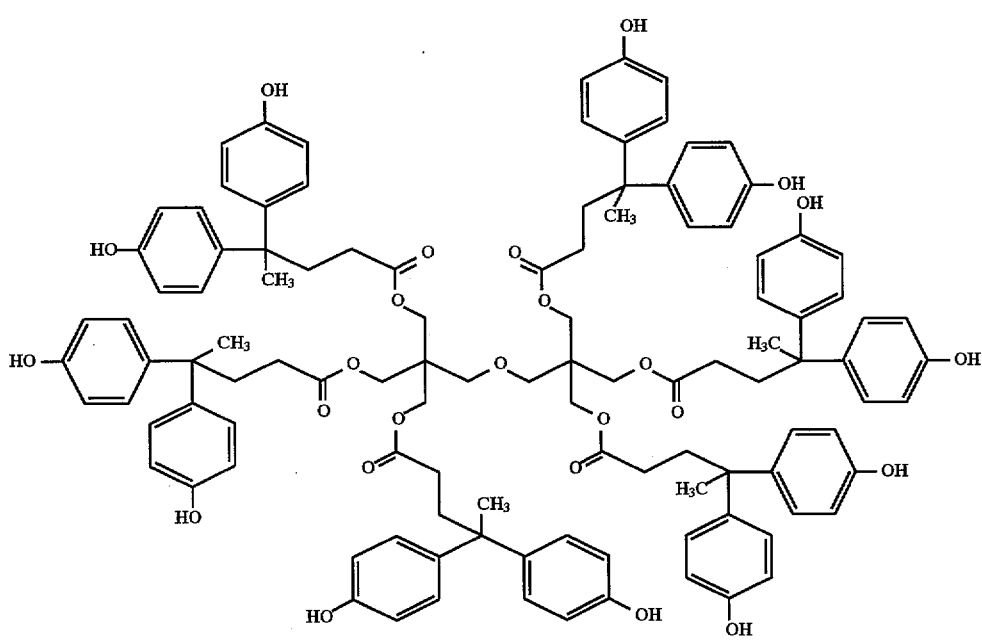

-continued
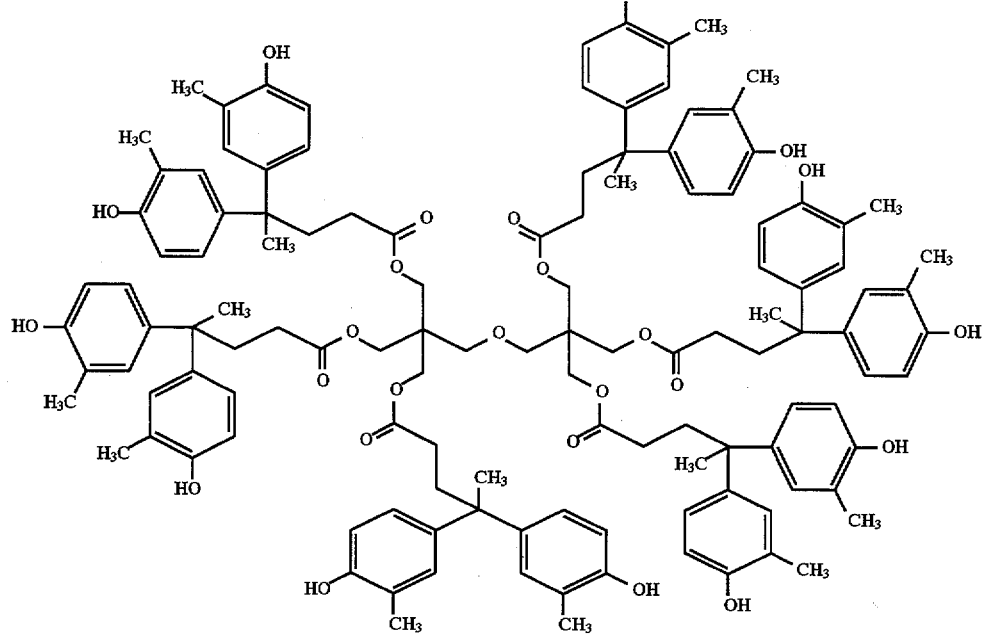
(I)-22
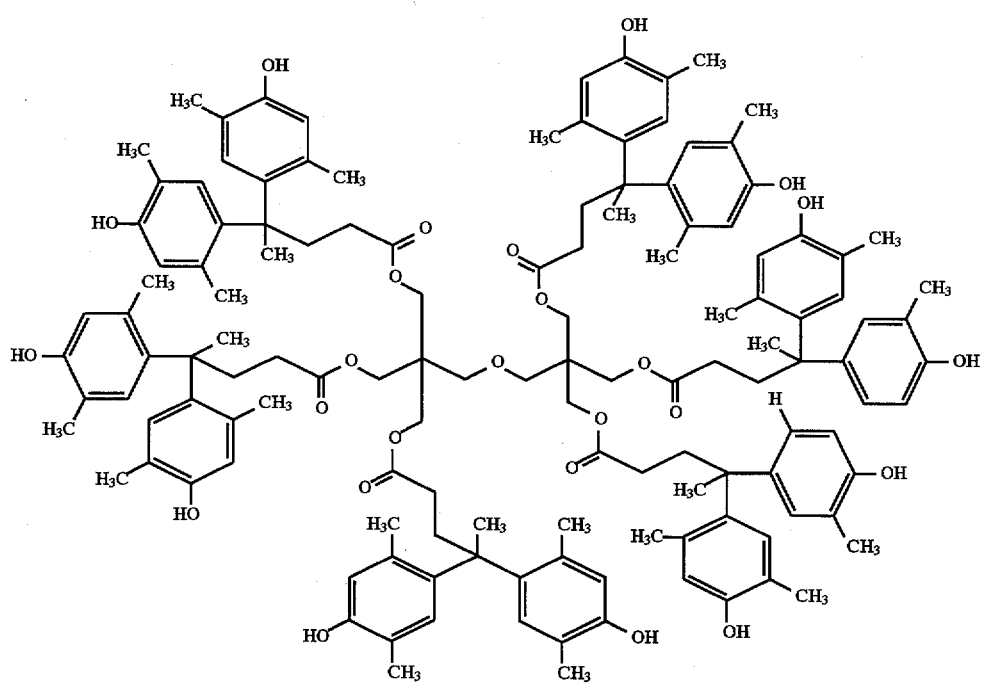
(I)-23

(I)-24
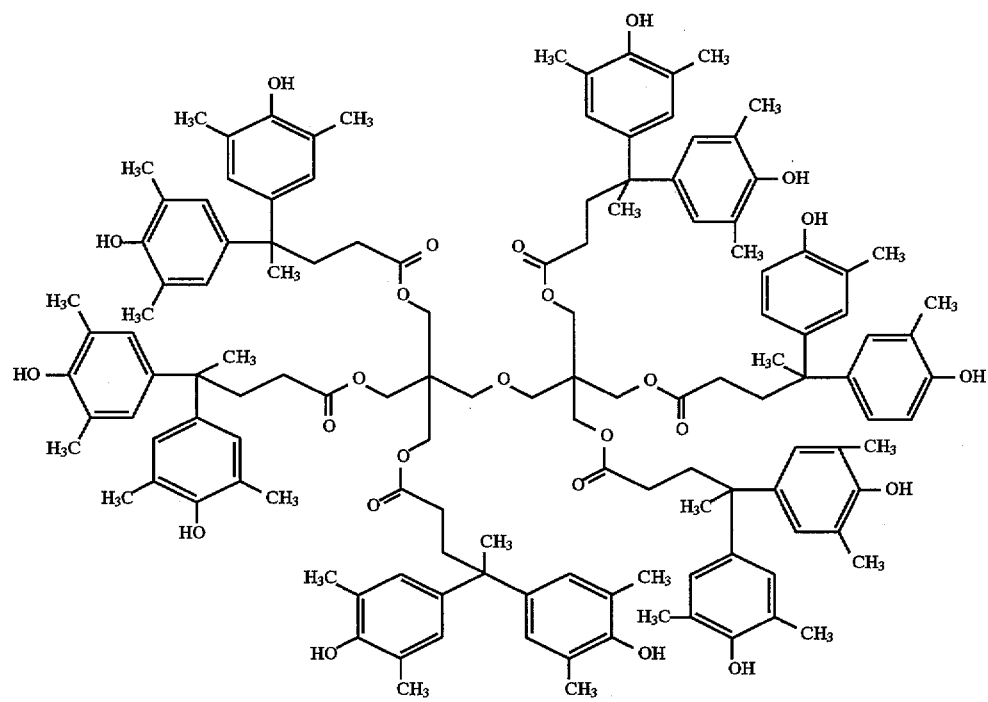
(I)-25
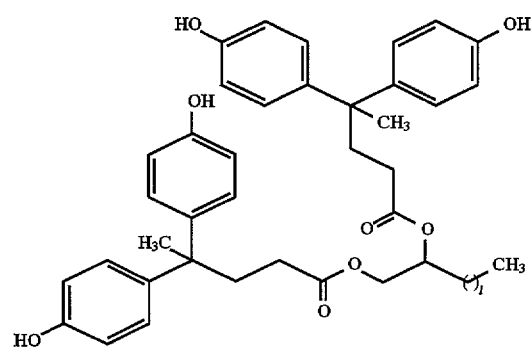
(I)-26
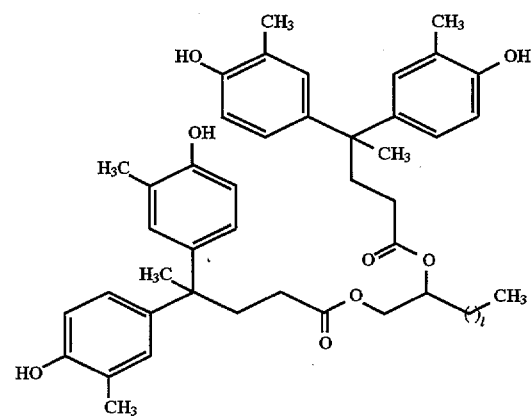

-continued
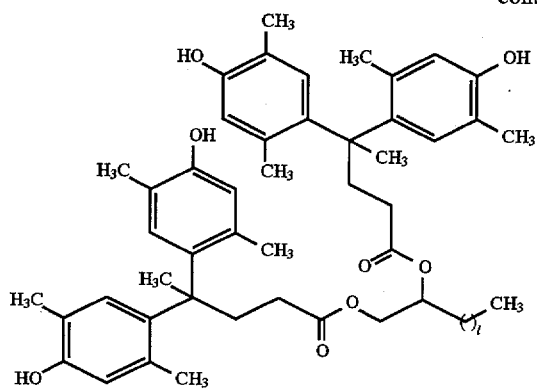
(I)-27
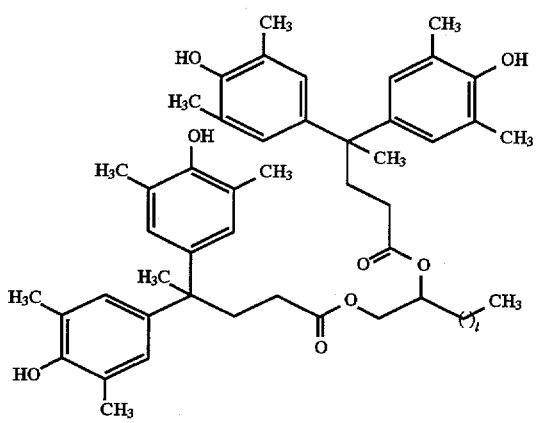
(I)-28
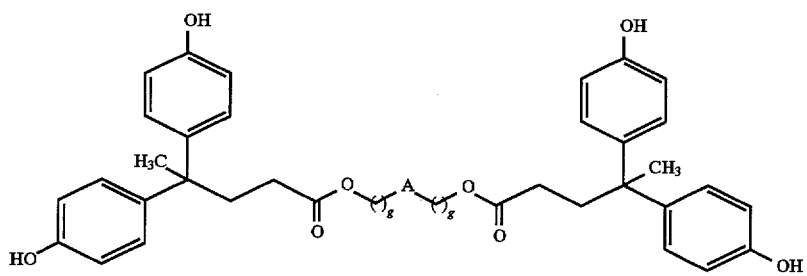
(I)-29
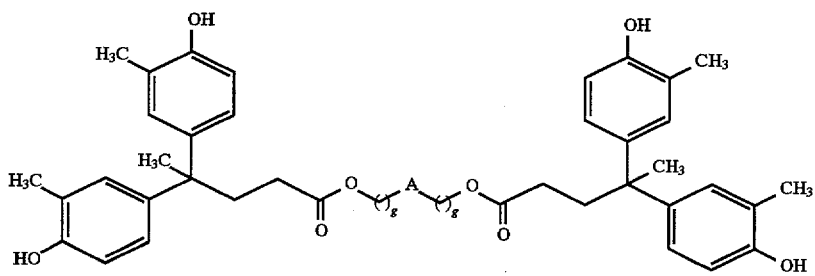
(I)-30
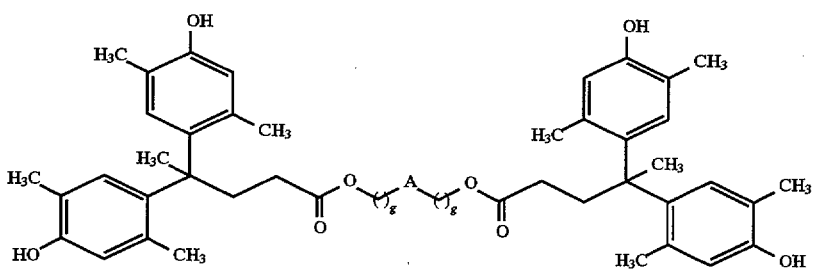
(I)-31

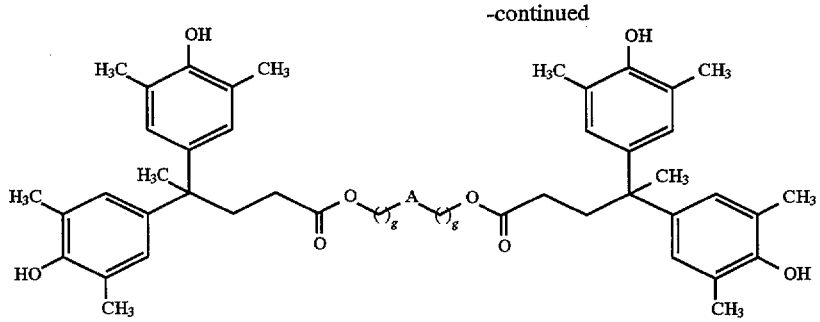

(I)-32 wherein e is an integer of 1 to 12, f is an integer of 0 to 12, g is an integer of 1 to 12, and A is one selected from the group consisting of O, S, $SO_2$ and SO.

To prepare quinonediazide sulfonic acid ester, 1,2-naphthoquinonediazide sulfonic acid halide or 1,2-benzoquinonediazide sulfonic halide is esterified with at least one species selected from the aromatic polyhydroxy compounds of the formula I, in the presence of amine catalyst. Its esterification degree can be easily controlled with the mole ratio between the aromatic polyhydroxy compound and 1,2-naphthoquinonediazide sulfonyl halide. The esterification degree preferably ranges from 30 to 90% and more preferably from 50 to 80%.

As for the alkali soluble resin, a novolak resin which is prepared by condensing an aldehyde compound with an phenolic compound in the presence of acid catalyst. Examples of phenolic compound include o-cresol, m-cresol, p-cresol, 2.5-xylenol, 3,5-xylenol, 3.4-xylenol, 2,3,5-trimethylphenol, 2-t-butylphenol, 3-t-butylphenol, 4-t-butylphenol, 2-ethylphenol, 3-ethylphenol, 4-ethylphenol, 2-chlorophenol, 3-chlorophenol, 4-chlorophenol and the like. As the aldehyde compound, formaldehyde, paraformaldehyde, acetaldehyde, propylaldehyde, benzaldehyde or phenylaldehyde may be used. As mentioned above, the condensation is carried out under the influence of an acid catalyst. Its examples include oxalic acid, formic acid, paratoluene sulfonic acid, hydrochloric acid, sulfuric acid, phosphoric acid, perchloric acid, zinc acetate and magnesium acetate.

Most compounds with a polystyrene-reduced molecular weight of 900 or less and unreacted materials are removed from the reaction for the novolak resin by well-known fraction processes. It is advantageous for high resolution and wide focusing point range that novolak resins with a polystyrene-reduced molecular weight of 2,000 to 12,000.

For the low molecular weight additive useful in the present invention, an alkali soluble compound with a molecular weight of around 900 is selected. Preferred is an aromatic polyhydroxy compound which shows little absorption peak at 340 and 375 nm. More preferable is the aromatic polyhydroxy compound which contains at least three aromatic hydroxy groups and has a molecular weight of around 600. In the present invention, at least one species which is selected from the compounds represented by the formula I may be used. The low molecular weight additive is preferably used at an amount of about 5 to 50 parts by weight based on 100 parts by weight of the alkali soluble resin.

Additives, if necessary, comprise dye, sensitizers, surfactants, stabilizers and adhesion improvers. Sensitizers may be exemplified by mercaptooxazol, mercaptobenzochisazol, mercaptooxazoline, mercaptobenzochiazol, benzochisazolinone, mercaptobenzoimizole, benzochiazolone, urazol, chiouracil, mercaptopyridine, imidazolone and the derivatives thereof.

The photoresist composition of the present invention is dissolved in a suitable solvent. A solvent which has an appropriate viscosity and evaporates at a moderate rate is useful to obtain a uniform and smooth coat. Examples of such solvent include ethylcellosolvacetate, propyleneglycol, monomethylether acetate, ethylpyruvate, n-amyl acetate, ethyl lactate, 2-heptanone, gamma-butyrolactone and cyclohexanone. As circumstances require, they may be used alone or in mixtures. Also, the solvent may be used in combination with highly polar solvents, such as dimethylformamide and N-methylpyrrolidone. Solvent is added at an amount, depending on its physical properties, that is, volatility and viscosity, such that it may be uniformly formed on a wafer.

With the photoresist composition of the present invention, patterns can be formed by a conventional procedure which comprises coating on a substrate, exposure and development. Examples of developing solution include aqueous solutions, such as sodium hydroxide, potassium hydroxide and ammonia, inorganic alkalis, aqueous secondary amine solutions, such as diethylamine and di-n-propylamine, aqueous tertially amine solutions, such as trimethylamine and triethylamine, and aqueous ammonium salt solutions, such as tetramethylammonium hydroxide. Those which are added with surfactants can be used.

A better understanding of the present invention may be obtained in light of the following examples which are set forth to illustrate, but are not to be construed to limit, the present invention.

PREPARATION OF POLYHYDROXY COMPOUNDS

SYNTHESIS EXAMPLE I

In a 1000 ml flask 100 g of 4,4-bis(4-hydroxyphenyl) valeric acid, 15.4 g of 1,4-butandiol, 1.7 g of dibutyl tin oxide, 100 ml of tetralin were added and slowly heated to 190° C. with stirring. Reaction was carried out for 6 hours under a reduced pressure of 70 mmHg and then, water, a by-product, was removed. Thereafter, tetralin remaining in the reactor was completely removed over 3 hours by reducing the pressure of the reactor into 20 mmHg. After completion of the reaction, the temperature of the reactor was adjusted into 80° C. The remaining reaction was added with 0.9 g of oxalic acid and 300 ml of ethanol, dissolved and filtered.

The filtrate was cooled to crystal, filtered and dried, to obtain 89 g of aromatic polyhydroxy compound represented by the following structural formula A, white powder.

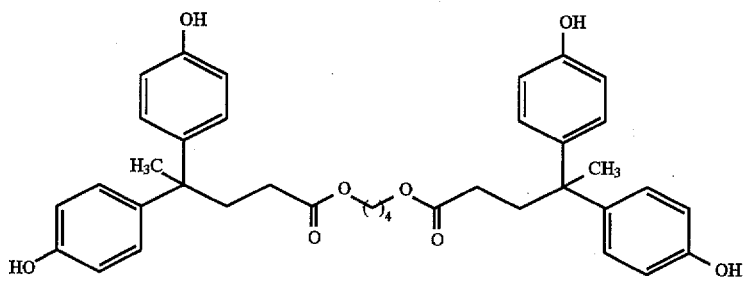

A

SYNTHESIS EXAMPLE II 94 g of the formula A was synthesized in a manner similar to that of Synthesis Example I, except that 105.2 g of 4,4-bis(4-hydroxyphenyl)valeric acid methyl ester was used, instead of 100 g of 4,4-bis(4-hydroxyphenyl)valeric acid.

SYNTHESIS EXAMPLE III

Synthesis Example II was repeated using 20 g of 1,6-hexanediol instead of 15.4 g of 1,4-butanediol, to obtain 91 g of the following structural formula B.

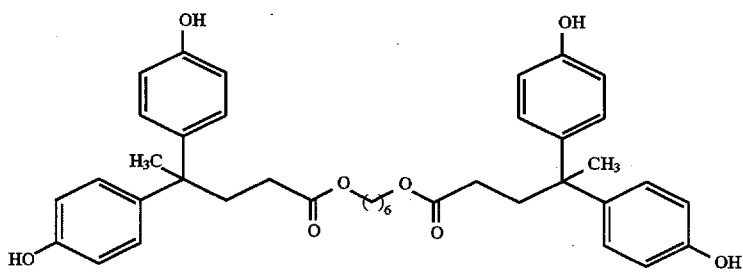

B

SYNTHESIS EXAMPLE IV

Synthesis Example II was repeated using 24.8 g of 1,8-octanediol instead of 15.4 g of 1,4-butanediol, to obtain 91 g of the following structural formula C.

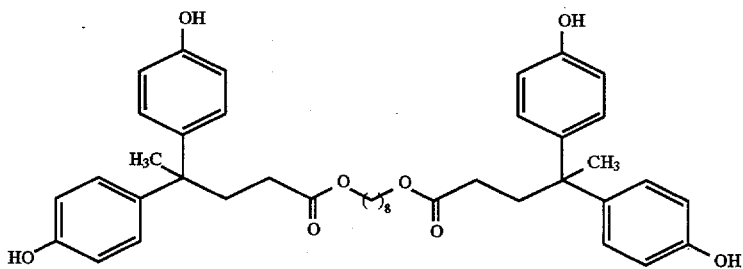

C

SYNTHESIS OF ALKALI SOLUBLE NOVOLAK RESIN

SYNTHESIS EXAMPLE V

A mixture of m-cresol:p-cresol:dimethyl phenols= 55:35:10 and aldehydes such as formalin were subjected to condensation reaction in the presence of an acid catalyst, to yield a novolak resin which had a polystyrene-reduced average molecular weight of 7,500 and showed a solvation rate of 100 Angstrom/sec upon immersion development in a solution commercially available from Hoechst, identified as "AZ 300 MIF".

PREPARATION OF 1,2-NAPHTHOQUINONEDIAZIDE SULFONIC ACID ESTER

SYNTHESIS EXAMPLE VI 10.0 g of the compound of the structural formula A obtained Synthesis Example I and 3.6 g of 1,2-naphthoquinone-2-diazide-5-sulfonyl chloride were dissolved in 50 ml of 1,4-dioxane and slowly added with 1.6 g of ethyl amine while stirring at ordinary temperatures. Thereafter, the mixture stood at the same temperature for 1 hour and the resulting reaction was slowly added in 500 ml of distilled water, to give precipitates. Then, the precipitates were filtered and dried to yield 12.2 g of photoresist 1,2-naphthoquinonediazide sulfonic acid ester. It was designated as Mixture E.

SYNTHESIS EXAMPLE VII

Synthesis Example VI was repeated using 1,2-naphthoquinone-2-diazide-5-sulfonic acid chloride at an amount of 3.1 g, instead of 3.6 g, so as to obtain 11.6 g of photoresist 1,2-naphthoquinonediazide sulfonic ester mixture, different in esterification degree from that of Synthesis Example V. It was designated as Mixture F.

SYNTHESIS EXAMPLE VIII

Synthesis Example VI was repeated using 10.5 g of Compound B instead of 10.0 g of Compound A, so as to obtain 11.6 g of photoresist 1,2-naphthoquinonediazide sulfonic ester mixture. It was designated as Mixture G.

SYNTHESIS EXAMPLE IX

Synthesis Example VI was repeated using 10.9 g of the compound of Formula C obtained in Synthesis Example IV instead of 10.0 g of the compound of Formula A obtained in Synthesis Example I, so as to obtain 13.2 g of photoresist 1,2-naphthoquinonediazide sulfonic ester mixture. It was designated as Mixture H.

Example I

A resist solution was prepared by dissolving 10 parts by weight of the alkali soluble novolak resin synthesized in Synthesis Example V, 3.5 parts by weight of photoresist quinonediazide Mixture E of Synthesis Example VI, and 1.2 parts by weight of the compound represented by Formula A of Synthesis Example I in ethylcellosolvacetate solution. The resist solution was uniformly coated a thickness of pore size 0.2 μm and thermally treated on a hot plate at 90° C. for 60 sec. After being exposed with a stepper, sold by Nikon, Japan, at numerical aperture 0.4, the coat was immersed for 60 sec in a developing solution commercially available Hoechst, Germany, identified as "AZ 300 MIF", to obtain resist patterns.

Likewise, the resist solution was uniformly coated on a silicon wafer and subjected to thermal treatment. Thereafter, this coat was exposed under a mask for development rate monitor (DRM), sold by Perkin-Elmer, U.S.A., with an ultraviolet exposer, sold by Quintel, U.S.A. Simulation was done according to the DRM test method. The result is given as shown in Table 1.

Example II

Example I was repeated using a resist solution prepared with 10 parts by weight of the alkali soluble resin of Synthesis Example V, 4.0 parts by weight of the photoresist quinonediazide Mixture F of Synthesis Example VII and 1.0 parts by weight of the compound represented by Formula A of Synthesis Example II.

Example III

Example I was repeated using photoresist quinone diazide Mixture G of Synthesis Example VII, instead of Mixture E of Synthesis Example VI.

Example IV

Example I was repeated using photoresist quinone diazide Mixture H of Synthesis Example IX, instead of Mixture E of Synthesis Example VI.

TABLE 1

| Exam. No. | DRM Simulation Resolution (μm) | Patterns Resolution (μm) | Sensitivity (msec) |
|---|---|---|---|
| I | 0.34 | 0.43 | 450 |
| II | 0.32 | 0.42 | 430 |
| III | 0.35 | 0.44 | 450 |
| IV | 0.35 | 0.44 | 460 | note
1 Pattern simulation using a DRM, sold by Perkin-Elmer, U.S.A. after exposure through a mask and then development.
conditions:
Initial Exposure Amount: 10 sec (Quintel UV exposer)

TABLE 1-continued

| Exam. No. | DRM Simulation Resolution (μm) | Patterns Resolution (μm) | Sensitivity (msec) |
|---|---|---|---|

Mask Transmission Rate: 1–60%, 15 steps
Imaginary Exposer: Input of Stepper for i line with NA 0.57
Development: AZ 300MIF (TMAH 2.38 wt %)/300 sec. Hoechst
2. Pattern test using a stepper, sold by Nikon, Japan, for i line with NA 0.40.

Other features, advantages and embodiments of the present invention disclosed herein will be readily apparent to those exercising ordinary skill after reading the foregoing disclosures. In this regard, while specific embodiments of the invention have been described in considerable detail, variations and modifications of these embodiments can be effected without departing from the spirit and scope of the invention as described and claimed.

What is claimed is:

1. A positive photoresist composition, comprising quinonediazide sulfonic acid ester, an alkali soluble resin, a solvent, and additives, said quinonediazide sulfonic acid ester being prepared through the esterification of 1,2-naphthoquinonediazidesulfonyl halide or 1,2-benzoquinonediazidesulfonyl halide with an aromatic hydroxy compound represented by the following structural formula I:

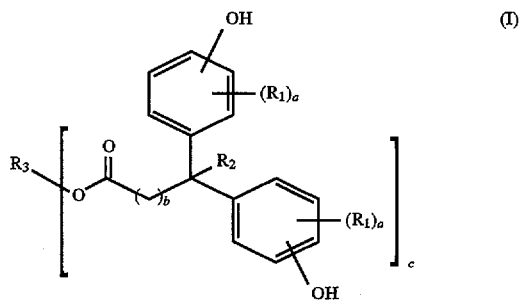

wherein $R_1$ and $R_2$ are independently hydrogen, halogen, an alkyl group or an alkoxy group;

a is an integer of 1 to 3;

b is an integer of 1 to 8;

c is an integer of 1 to 12; and $R_3$ is an alkyl group containing ether, mercapthane, sulfoxide, sulfone, aryl group or hydroxy group.

2. A positive photoresist composition in accordance with claim 1, wherein said quinonediazidesulfonic acid ester is of a mixture in which at least one hydroxy group of the aromatic hydroxy compound of Formula I is substituted by 1,2-naphthoquinonediazidesulfonyl halide or 1,2-benzoquinonediazidesulfonyl halide and which has an esterification degree of 50 to 80%.

3. A positive photoresist composition in accordance with claim 1, wherein said aromatic hydroxy compound of Formula I is selected from the group consisting of the compounds represented by the following structural formula I-1 to I-32:

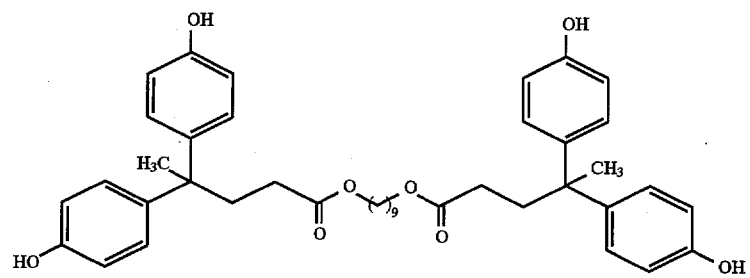
(I)-1
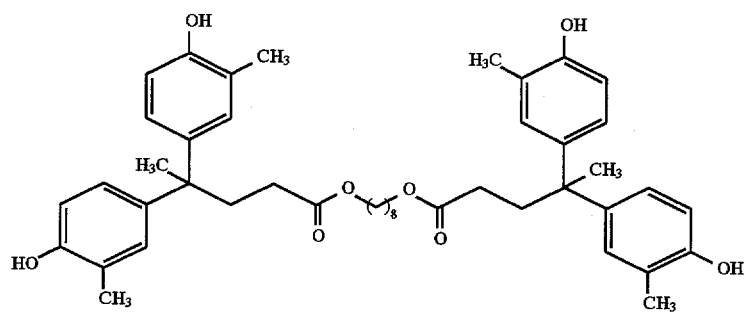
(I)-2
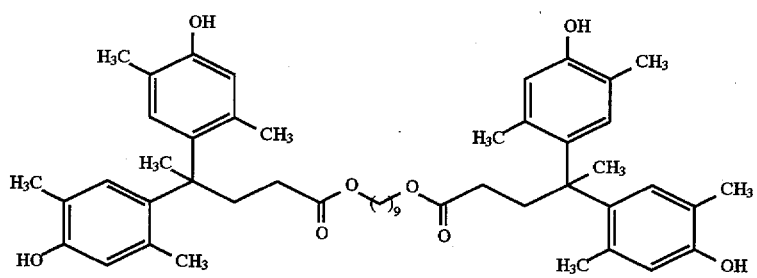
(I)-3
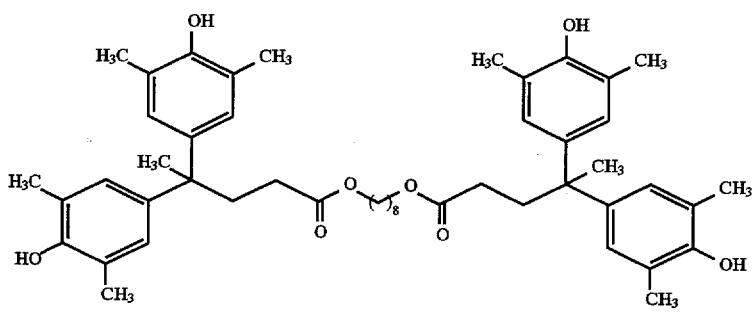
(I)-4
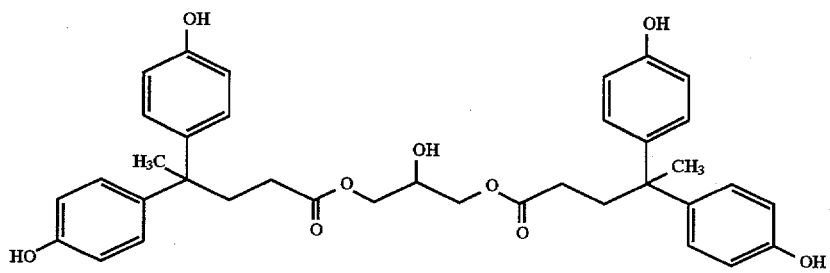
(I)-5

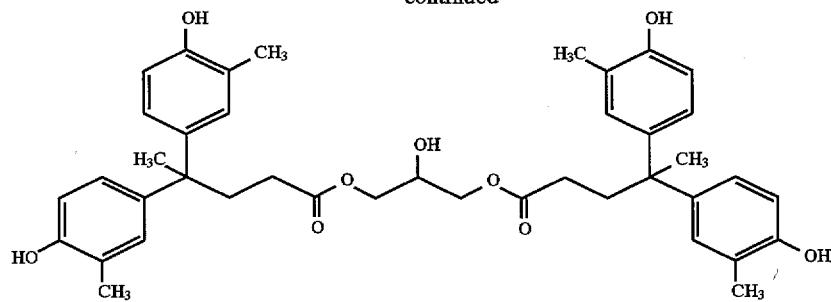 (I)-6
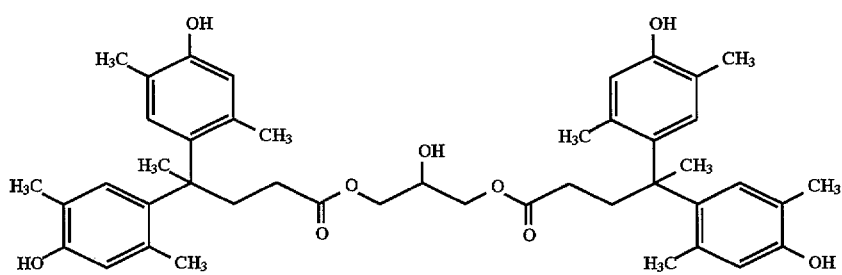 (I)-7
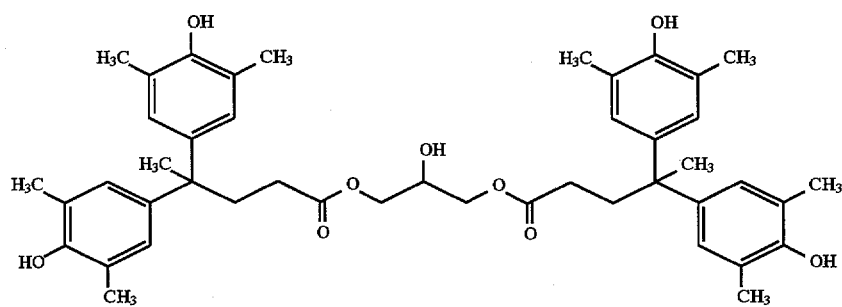 (I)-8
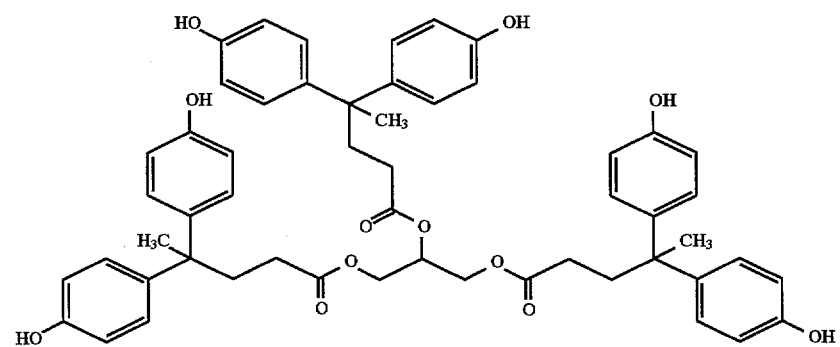 (I)-9
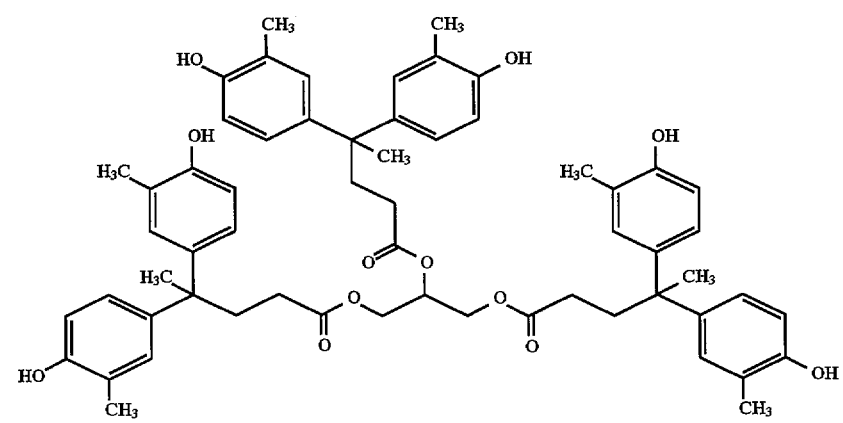 (I)-10

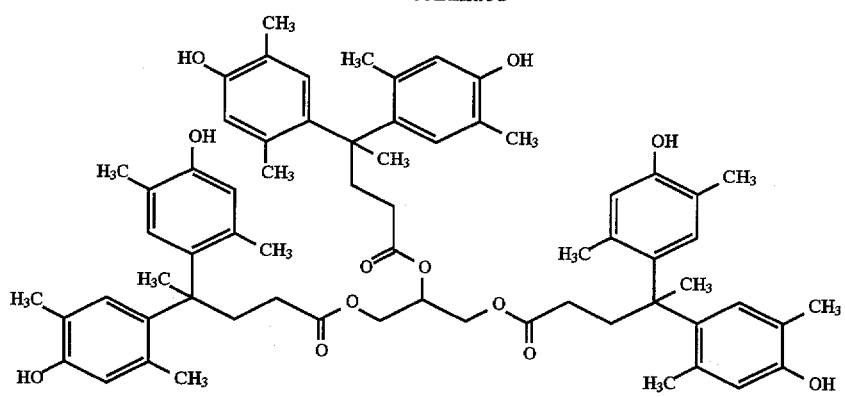
(I)-11
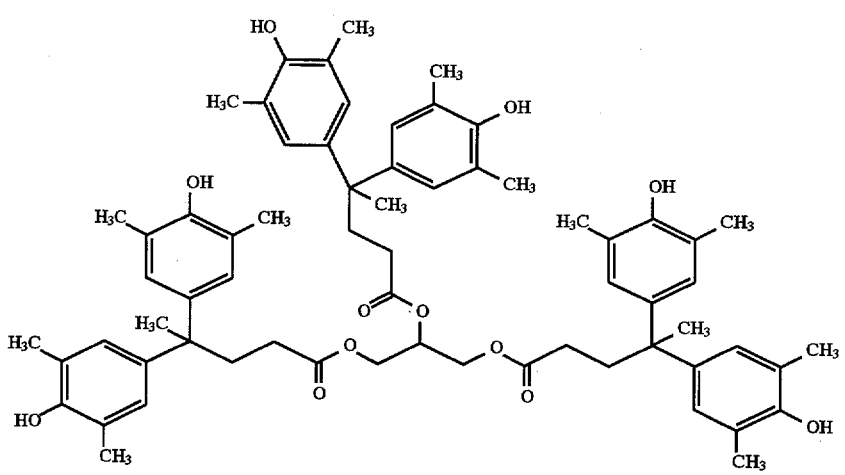
(I)-12
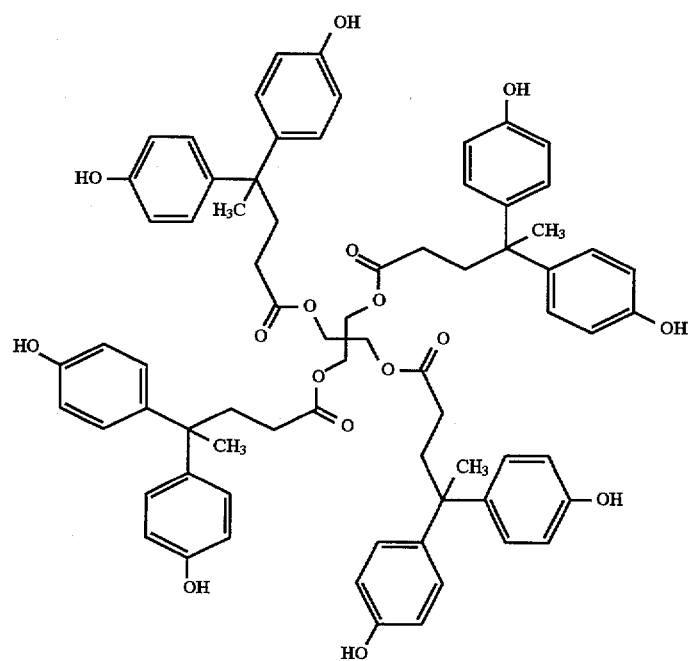
(I)-13

-continued
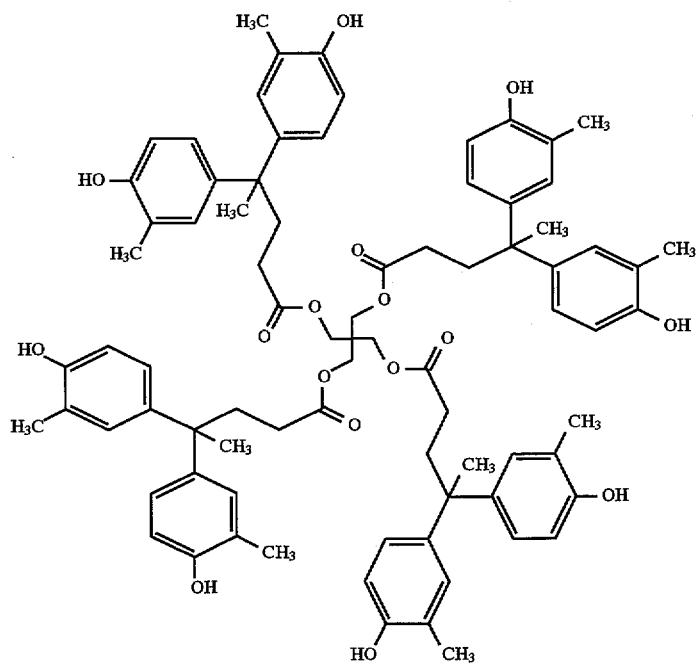
(I)-14
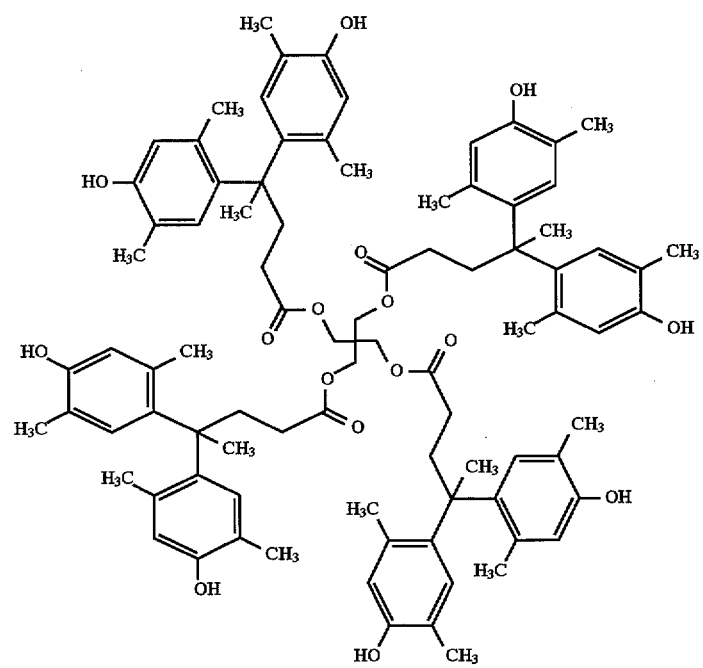
(I)-15

(I)-16
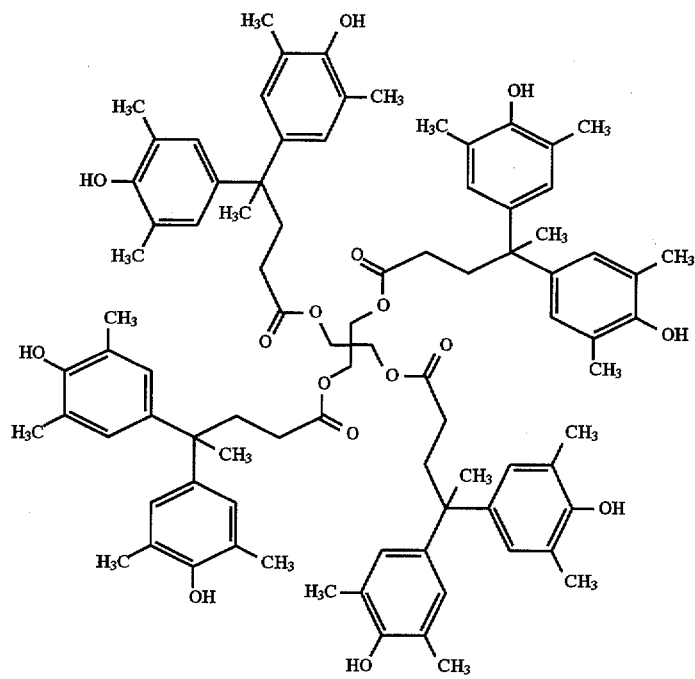
(I)-17
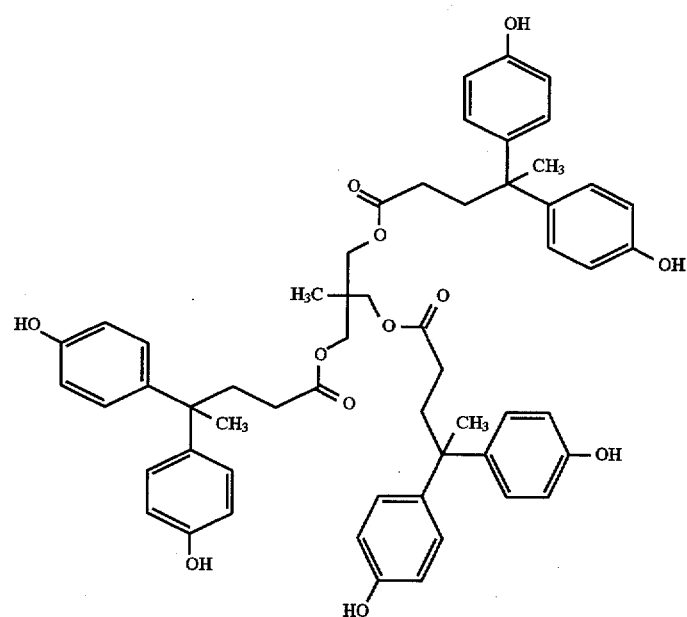

-continued
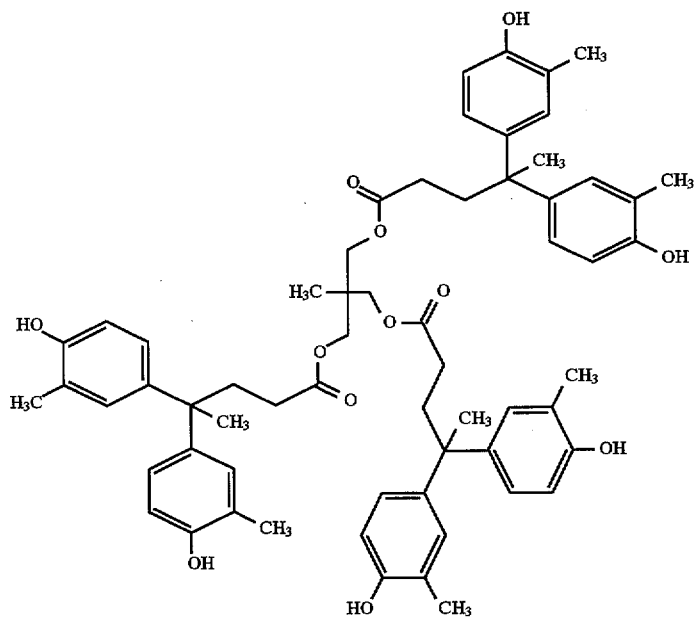
(I)-18
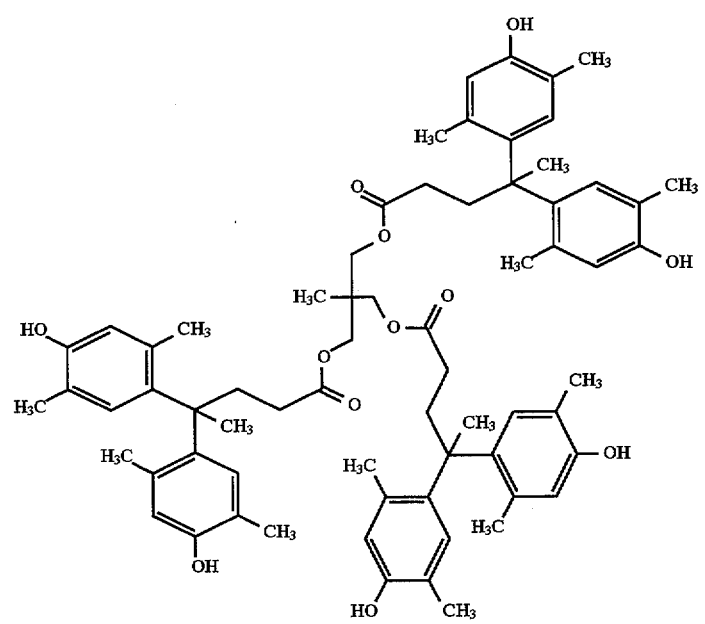
(I)-19

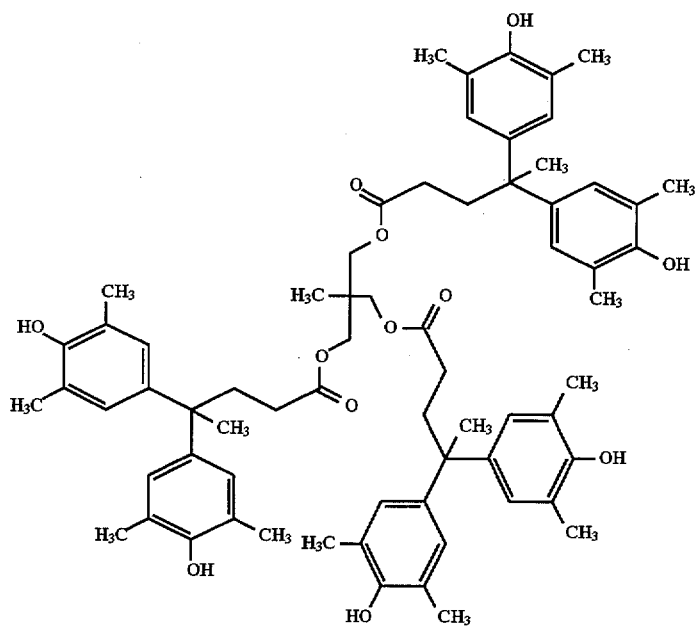
(I)-20
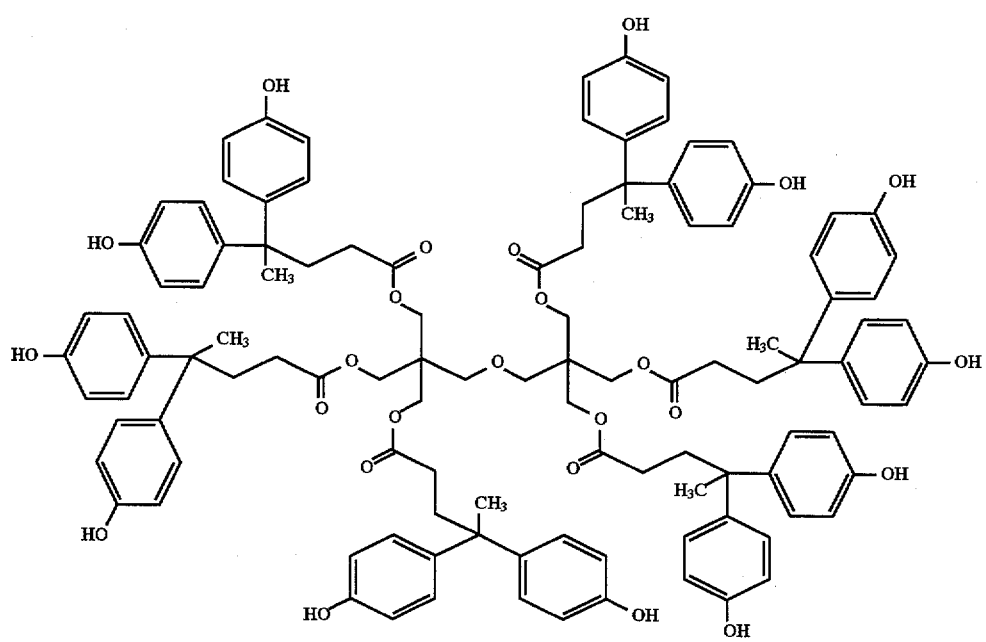
(I)-21

(I)-22
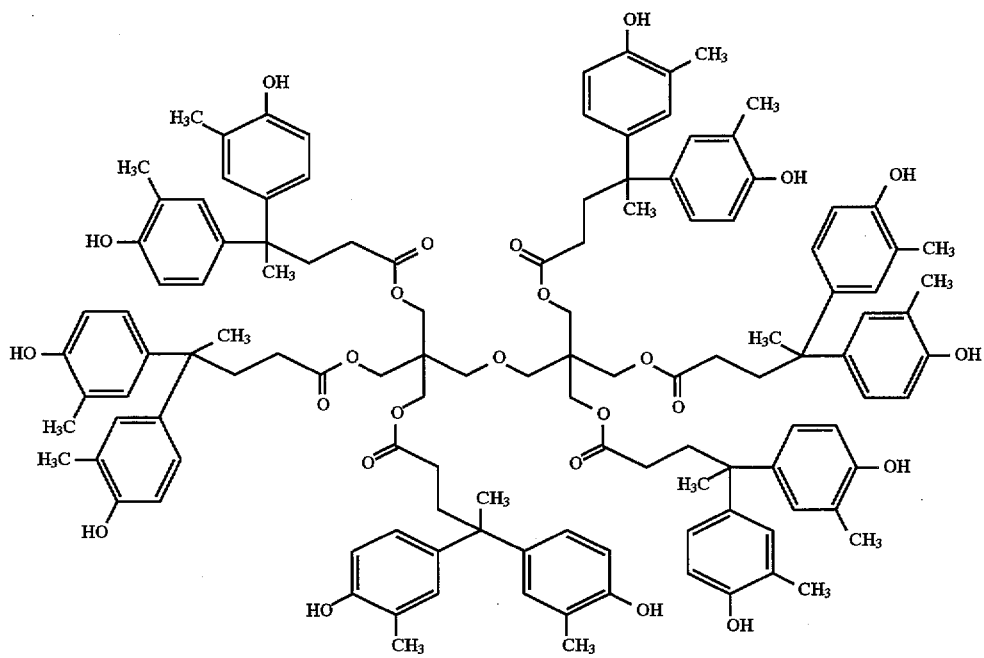
(I)-23
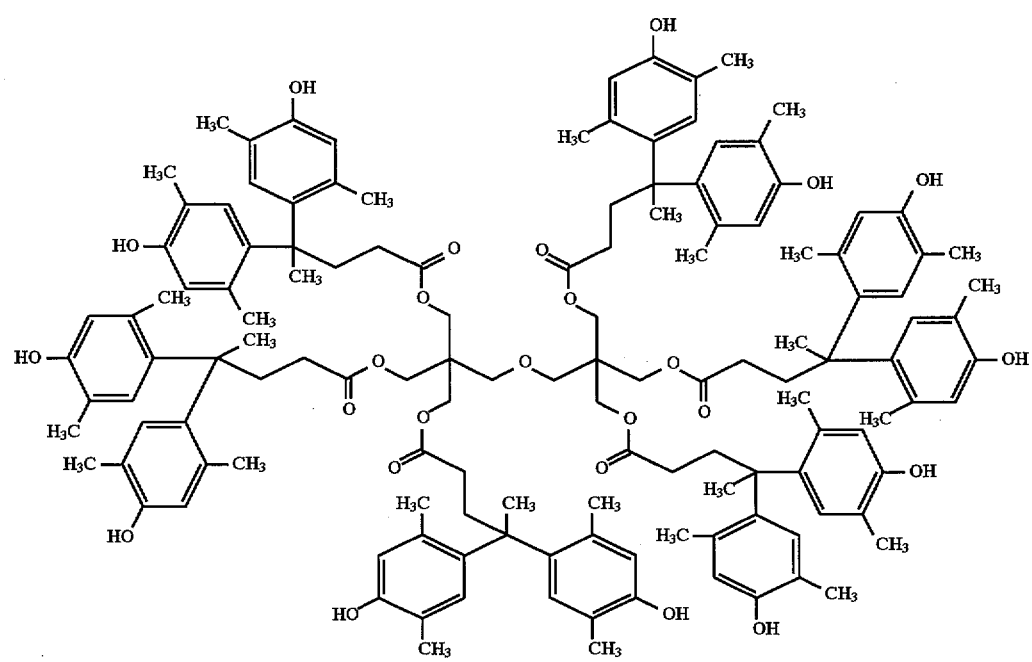

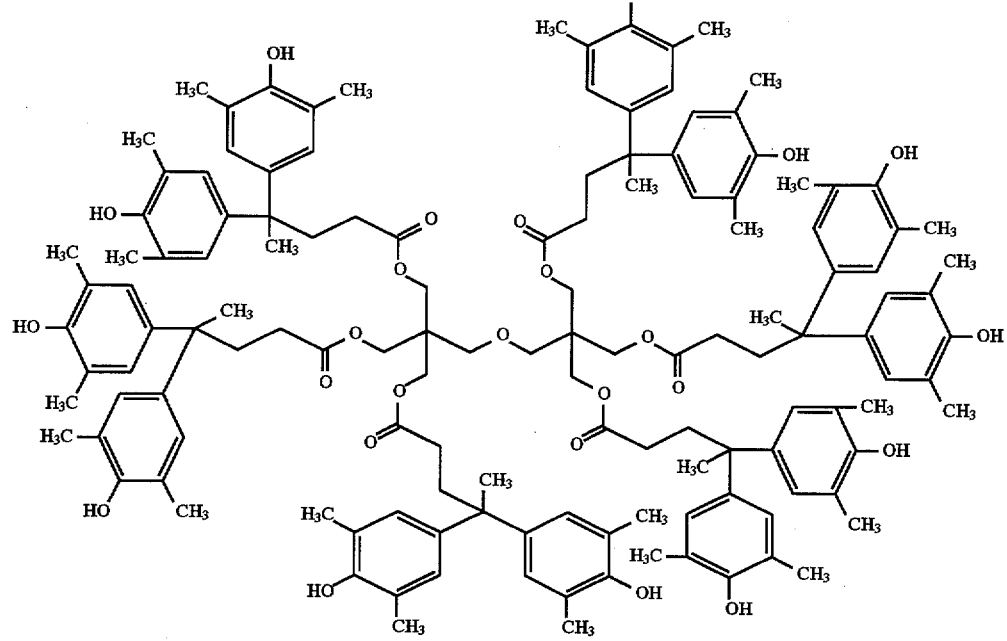
(I)-24
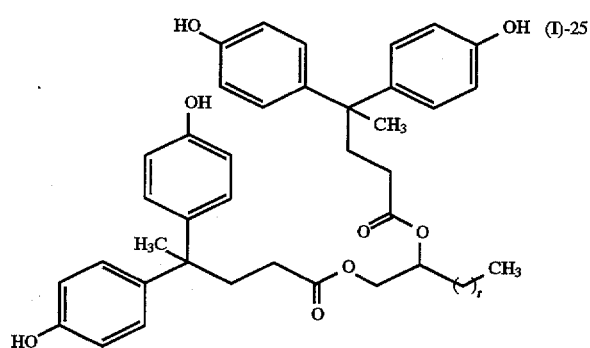
(I)-25
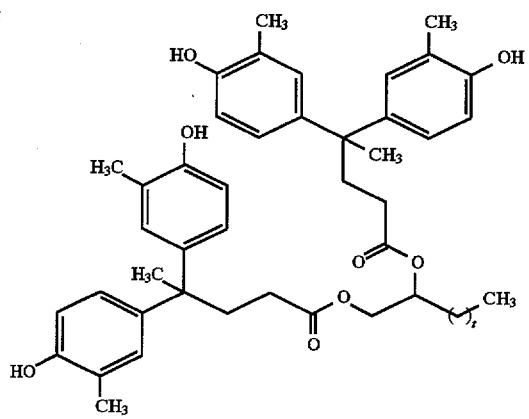
(I)-26
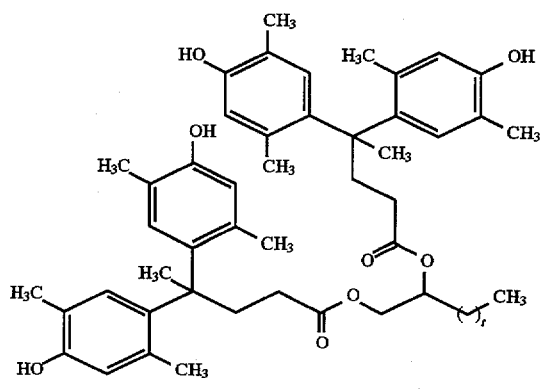
(I)-27
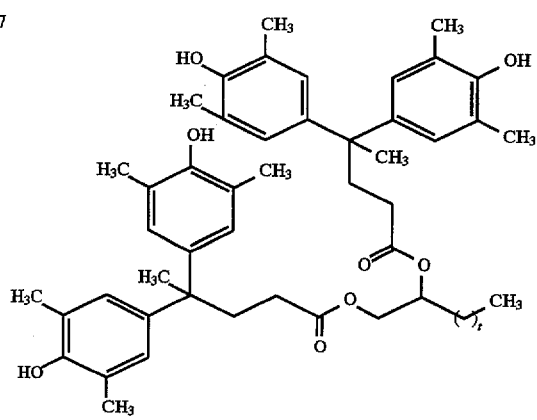
(I)-28

-continued

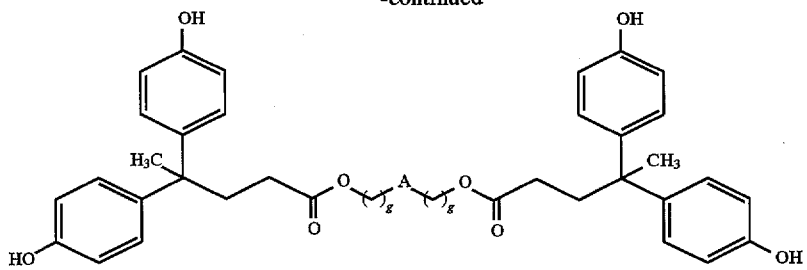 (I)-29

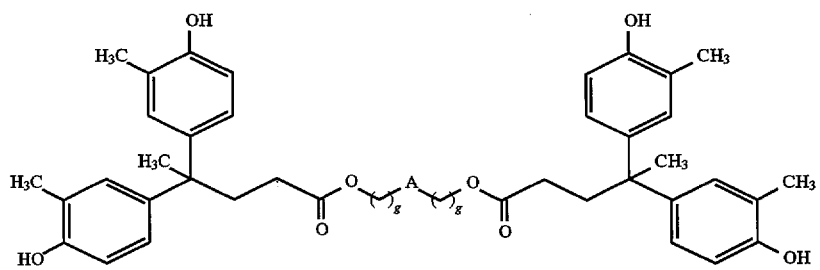 (I)-30

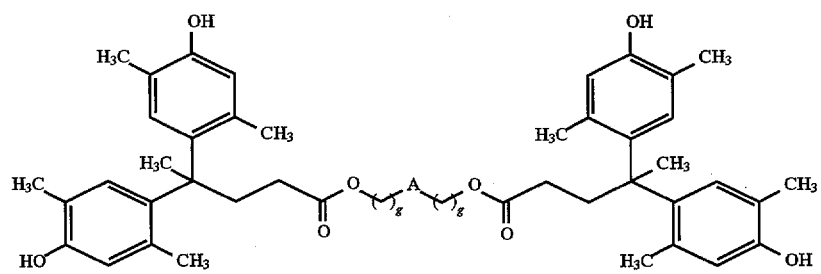 (I)-31

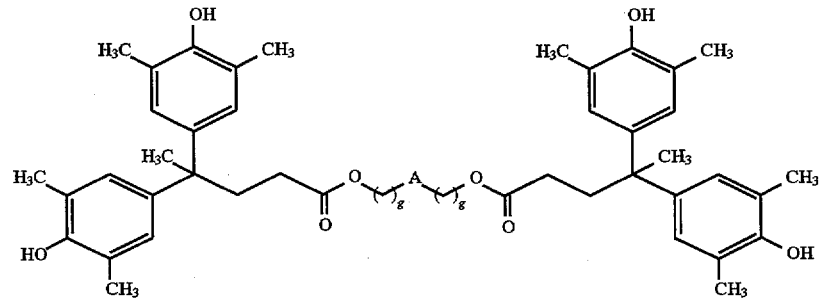 (I)-32 wherein e is an integer of 1 to 12;

f is an integer of 0 to 12;

g is an integer of 1 to 12; and

A is one selected from the group consisting of O, S, $SO_2$ and SO.

4. A positive photoresist composition in accordance with claim 1, wherein said quinonediazide sulfonic acid ester is present at an amount of about 10 to 100 parts by weight based on 100 parts by weight of said alkali soluble resin.

5. A positive photoresist composition in accordance with claim 1, wherein said additives comprise at least species of low molecular weight selected from the group consisting of the compounds represented by Formula I.

6. A positive photoresist composition in accordance with claim 5, wherein said low molecular weight additive is present at an amount of about 5 to 50 parts by weight based on 100 parts by weight of alkali soluble resin.

7. A positive photoresist composition in accordance with claim 1, wherein said alkali soluble resin is prepared through the condensation of at least one phenol species selected from the group consisting of o-cresol, m-cresol, p-cresol, 2,5-xylenol, 3,5-xylenol, 3,4-xylenol, 2,3,5-trimethylphenol, 2-t-butylphenol, 3-t-butylphenol, 4-t-butylphenol, 2-ethylphenol, 3-ethylphenol, 4-ethylphenol, 2-chlorophenol, 3-chlorophenol and 4-chlorophenol, with at least aldehyde species selected from the group consisting of formaldehyde, paraformaldehyde, acetaldehyde, propylaldehyde, benzaldehyde and phenylaldehyde.

8. A positive photoresist composition in accordance with claim 7, wherein said alkali soluble resin is prepared in the presence of at least one condensing catalyst selected from the group consisting of oxalic acid, formic acid, paratoluenesulfonic acid, hydrochloric acid, sulfuric acid, phosphoric acid, perchloric acid, zinc acetate and magnesium acetate.

9. A positive photoresist composition in accordance with claim 1, wherein said alkali soluble resin has a polystyrene-reduced weight average molecular weight of about 2,000 to 12,000.

* * * * *